United States Patent
Schestak

(10) Patent No.: US 6,927,961 B2
(45) Date of Patent: Aug. 9, 2005

(54) DATA PROCESSING APPARATUS

(75) Inventor: Wolfgang Schestak, Gablingen (DE)

(73) Assignee: Fujitsu Siemens Computers GmbH, Munich (DE)

( * ) Notice: Subject to any disclaimer, the term of this patent is extended or adjusted under 35 U.S.C. 154(b) by 0 days.

(21) Appl. No.: 10/628,719

(22) Filed: Jul. 28, 2003

(65) Prior Publication Data

US 2004/0027766 A1 Feb. 12, 2004

(30) Foreign Application Priority Data

Jul. 26, 2002 (DE) .......................................... 102 34 179

(51) Int. Cl.[7] ............................ H02H 5/04; G01K 1/08
(52) U.S. Cl. ........................ 361/103; 361/694; 702/132
(58) Field of Search ...................... 62/178, 177, 259.2; 361/103, 696, 694; 165/80.3

(56) References Cited

U.S. PATENT DOCUMENTS 5,586,250 A 12/1996 Carbonneau et al.
6,134,667 A * 10/2000 Suzuki et al. ............... 713/300
6,237,112 B1 5/2001 Yoo et al.

FOREIGN PATENT DOCUMENTS

DE 199 30 166 A1 1/2001
WO 01/03483 A1 1/2001

OTHER PUBLICATIONS

"Information Technology—SCSI Primary Commands—2 (SPC–2) Online!", Jul. 18, 2001, 4 pages, XP–002285939.

* cited by examiner

Primary Examiner—Chen Wen Jiang
(74) Attorney, Agent, or Firm—Laurence A. Greenberg; Werner H. Stemer; Ralph E. Locher

(57) ABSTRACT

The invention relates to a data processing apparatus having temperature sensors, at least one fan for cooling the data processing apparatus, and a monitoring unit connected to the temperature sensors and to one or more fans. The monitoring unit controls the fans as a function of measured values from the temperature sensors. The data processing apparatus also includes at least one hard disk that has a temperature sensor. According to the invention, the data processing apparatus is characterized in that an interface apparatus is provided for checking the hard disk temperature sensor or sensors and for supplying the measured temperature values for the monitoring unit.

2 Claims, 1 Drawing Sheet

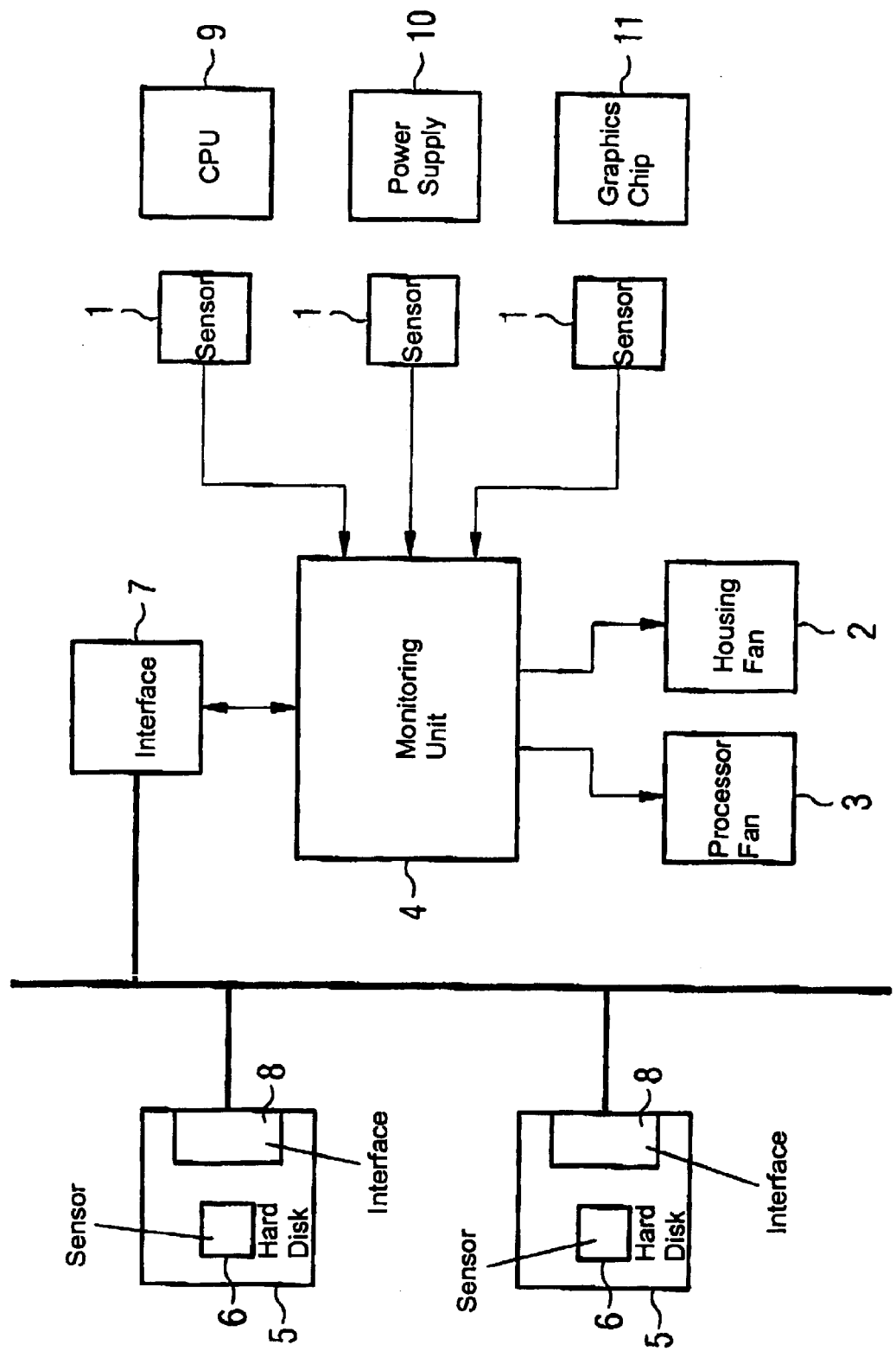

DATA PROCESSING APPARATUS

BACKGROUND OF THE INVENTION

Field of the Invention

The invention relates to a data processing apparatus having at least one temperature sensor, at least one fan for cooling the data processing apparatus, a monitoring unit connected to the temperature sensor and to the fan, and at least one hard disk having a temperature sensor. The fan can be controlled as a function of measured values from the temperature sensor.

Modern data processing apparatus are equipped with a complex temperature monitoring device of this type in order to ensure, even for a high-performance data processing apparatus and its individual components, that temperatures which exceed permissible limit values do not occur in individual areas of the data processing apparatus, or in the housing in which it is accommodated.

In previously known data processing apparatus, the cooling always worked at full power, which ensured that no overheating can occur. One problem in this case was that a large amount of cooling power is also associated with producing a large amount of noise. For this reason, new data processing apparatus have been equipped with a fan that can be controlled as a function of temperature and that is operated at full power only when this is also necessary. When the temperature of the data processing apparatus or the temperature in its housing is low, the fan is either switched off entirely or is operated at a reduced power.

However, during operation with a low cooling power as a standard, the risk that individual areas of the data processing apparatus will become too hot increases. This is due to the fact that individual components are very heavily loaded and in consequence produce a large amount of heat, while other components are loaded to a lesser extent and thus also require less cooling power. The load on individual components depends not only on the respective configuration of the data processing apparatus, but also on the respective application. In an application that includes intensive processing of graphics data, the graphics chip is, of course, more heavily loaded than in a pure text processing application.

In order to take account of the large number of temperature-critical components, data processing apparatus often have a number of temperature sensors that record temperature measurement values at various points in the data processing apparatus and in the housing, and provide these temperature measurement values in order to control the fan or fans. At least one housing fan is generally provided as the fan, and is normally integrated in the power supply. Furthermore, a processor fan is also provided, and additionally cools the main processor. Particularly in the case of servers, a number of fans are provided that take account of the particularly large amount of heat that is produced, or that are provided in redundant form in order to improve the reliability of the overall system.

However, one problem is that data processing devices also have additional installed components that are not integrated in the temperature control concept of the data processing apparatus. Hard disks are particularly critical in this case, since they also produce a large amount of heat. A high hard disk temperature is detected by temperature sensors that are fitted in the housing in the vicinity of the hard disk or on the installation cage. One problem in this case is that there is a relatively long time interval between an unacceptably high temperature occurring in the hard disk and the identification by the temperature sensors that the limit value has been exceeded. This can damage the hard disk without this being identified in good time by the temperature sensors and without it being possible to avoid this damage by an appropriate fan control. Modern hard disks admittedly often have integrated temperature sensors, but these cannot be used for fan control. One possible solution to the problem is to operate the fans "on suspicion" at a higher power level than is necessary on the basis of the instantaneous temperature measured values. However, this once again leads to producing a greater amount of noise, which is generally regarded as disturbing and should be avoided.

SUMMARY OF THE INVENTION

It is accordingly an object of the invention to provide a data processing apparatus that overcomes the above-mentioned disadvantages of the prior art apparatus of this general type.

In particular, it is an object of the invention to provide a data processing apparatus that allows adequate cooling of hard disks.

This object is achieved by a data processing apparatus of the type mentioned initially, which is characterized in that an interface apparatus is provided for checking the hard disk temperature sensor or sensors and for producing the temperature measured values for the monitoring unit.

The inventive interfaces also make it possible to integrate hard disks in the temperature control concept of a data processing apparatus. The interface is advantageously designed such that no additional cable connection need be created in order to access the measured value from the temperature sensor for the hard disk and, instead, the interface is designed such that access is possible via the data interface of the hard disk. In one preferred embodiment, this is a data interface in accordance with the SCSI (small computer system interface) standard.

Direct access to the temperature sensor for the hard disk allows the temperature to be detected at the point at which the heat is produced. No change is necessary on the hard disk if the interface apparatus accesses the data interface of the hard disk. On the data processing apparatus, all that is required is to connect the monitoring unit to a suitable interface apparatus, which is able to check the data interface of the hard disk.

With the foregoing and other objects in view there is provided, in accordance with the invention, a data processing apparatus including: at least one temperature sensor; at least one fan for cooling the data processing apparatus; and a monitoring unit connected to the temperature sensor and to the fan. The monitoring unit controls the fan as a function of measured values obtained from the temperature sensor. The data processing apparatus also includes at least one hard disk including a temperature sensor an interface apparatus for checking the temperature sensor of the hard disk. The interface apparatus is for supplying measured temperature values to the monitoring unit.

Other features which are considered as characteristic for the invention are set forth in the appended claims.

Although the invention is illustrated and described herein as embodied in a data processing apparatus, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWING

The drawing FIGURE is a schematic illustration of a data processing apparatus.

DESCRIPTION OF THE PREFERRED EMBODIMENTS

The drawing figure shows the components of a data processing apparatus that are relevant for the invention. Components that produce heat are, for example, a CPU 9, a power supply 10 or a graphics chip 11. The components mentioned are representative of points within the data processing apparatus where a locally increased amount of heat is produced and where the risk that the temperature limit value will be exceeded is thus particularly high. Temperature sensors 1 are arranged in the vicinity of these hot spots. These temperature sensors 1 are connected to a monitoring unit 4, which monitors the measured temperature values. The monitoring unit 4 is also connected to fans. In FIG. 1, these fans are a housing fan 2 and a processor fan 3. The fans 2 and 3 are driven as a function of the temperatures measured by the temperature sensors 1. In addition, two hard disks 5 are provided, and each have an SCSI interface 8. The hard disks 5 can be connected via this interface and via an SCSI bus connection (which is not shown) to the CPU, to a memory or to other components for data transmission. It is also possible to control specific functions of the hard disk via this interface. One of these functions is the reading of a temperature which is measured at that instant by a temperature sensor 6 which is arranged within the hard disk.

This function of the hard disks 5 is, according to the invention, also used to control the fans 2 and 3 as a function of the temperature of the hard disks 5. An additional interface apparatus 7 is provided for this purpose, and can access the SCSI interfaces 8 of the hard disks 5 in order to read the measured temperature values from the temperature sensors 6. The interface apparatus 7 is once again connected to the monitoring unit 4, in order to allow this to control the fans 2 and 3 as appropriate.

Initiated by the monitoring unit 4, the interface apparatus 7 sends a command to the hard disks 5 for them to output the instantaneous temperature measured value. The temperature measured value is then produced by the hard disks 5 at their SCSI interface 8, and is transmitted to the interface apparatus 7. The interface apparatus 7 transmits the temperature measured values in some suitable form to the monitoring unit 4, so that it can identify whether the hard disk temperature is raised and the housing fan 2 must in this case be readjusted in order to provide greater cooling for the hard disks 5.

The data processing apparatus ensures that the fans are not operated at a higher power level than is required for cooling the hard disks or other components in the data processing apparatus.

Even if a raised hard disk temperature does not lead to destruction of the hard disks 5, the raised temperature shortens the life (MTBF: mean time between failure) of the hard disks 5. Since the integration of the hard disks in the temperature control for the data processing apparatus makes it possible to keep the hard disk temperatures low, this leads to the hard disks having a longer life, and thus also to better reliability of the data processing apparatus.

I claim:

1. A data processing apparatus, comprising:

at least one temperature sensor;

at least one fan for cooling the data processing apparatus;

a monitoring unit connected to said temperature sensor and to said fan, said monitoring unit controlling said fan as a function of measured values obtained from said temperature sensor;

at least one hard disk including an integrated temperature sensor and a data interface; and an interface apparatus for checking said temperature sensor of said hard disk;

said interface apparatus accessing said data interface of said hard disk for supplying measured temperature values of said hard disk to said monitoring unit.

2. The data processing apparatus according to claim 1, wherein:

said data interface is designed in accordance with a SCSI standard.

\* \* \* \* \*